(12) United States Patent
Gruber et al.

(10) Patent No.: US 12,563,710 B2
(45) Date of Patent: Feb. 24, 2026

(54) DEVICE FOR PROTECTION AGAINST ELECTROSTATIC DISCHARGES IN ELECTRONIC COMPONENTS

(71) Applicant: PolyIC GmbH & Co. KG, Fürth (DE)

(72) Inventors: Mathias Gruber, Fürth (DE); Andreas Ullmann, Fürth (DE)

(73) Assignee: PolyIC GmbH & Co. KG, Fürth (DE)

( * ) Notice: Subject to any disclaimer, the term of this patent is extended or adjusted under 35 U.S.C. 154(b) by 158 days.

(21) Appl. No.: 18/568,012

(22) PCT Filed: Jun. 7, 2022

(86) PCT No.: PCT/EP2022/065392
§ 371 (c)(1),
(2) Date: Dec. 7, 2023

(87) PCT Pub. No.: WO2022/263230
PCT Pub. Date: Dec. 22, 2022

(65) Prior Publication Data
US 2024/0373605 A1     Nov. 7, 2024

(30) Foreign Application Priority Data

Jun. 18, 2021    (DE) ..................... 10 2021 115 816.8

(51) Int. Cl.
*H05K 9/00*          (2006.01)
(52) U.S. Cl.
CPC ................................. *H05K 9/0067* (2013.01)
(58) Field of Classification Search
CPC ..... H05K 9/0067; H10D 89/911; H01L 23/60
USPC ......................................... 361/212
See application file for complete search history.

(56) References Cited

U.S. PATENT DOCUMENTS

| | | | |
|---|---|---|---|
| 7,076,089 B2 | 7/2006 | Brandt et al. | |
| 9,513,758 B2 | 12/2016 | Fix et al. | |
| 9,978,673 B2 | 5/2018 | Tang et al. | |
| 2005/0270273 A1* | 12/2005 | Marten | G06F 3/0446 |
| | | | 345/173 |

(Continued)

FOREIGN PATENT DOCUMENTS

| | | |
|---|---|---|
| CN | 106972007 A | 7/2017 |
| CN | 111816643 A | 10/2020 |

OTHER PUBLICATIONS

International Search Report.
German Examination Report.

*Primary Examiner* — Kevin J Comber
(74) *Attorney, Agent, or Firm* — Hoffmann & Baron, LLP

(57)          ABSTRACT

A device for protection against electrostatic discharge in electric, electronic and optoelectronic components, in particular those which are present in the form of printed components. This relates, for example, to components from the field of flexible electronics, such as e.g. touch screens, multi-touch screens, displays and other input and output devices which are touched by the user and comprise read-out electronics, circuits, in particular printed circuits, and/or sensors. Through the provision of simple discontinuities and/or exposure of certain points or areas of the dissipative structures of an electric, electronic and/or optoelectronic component, an electrostatic discharge taking place is directed thereto, and thus a random electrostatic discharge with expected damage to the layer electrode(s) of the component can be prevented.

11 Claims, 17 Drawing Sheets

1

(56)  References Cited

U.S. PATENT DOCUMENTS

| | | |
|---|---|---|
| 2008/0203545 A1 | 8/2008 | Kato |
| 2012/0127686 A1 | 5/2012 | Hsu et al. |
| 2012/0193130 A1* | 8/2012 | Fix .......................... G06F 3/045 |
| | | 174/255 |
| 2013/0293508 A1* | 11/2013 | Lin ....................... G06F 3/0443 |
| | | 345/173 |
| 2014/0092519 A1 | 4/2014 | Yang |
| 2017/0179098 A1* | 6/2017 | Yoo ....................... H01L 23/552 |
| 2019/0041372 A1 | 2/2019 | Wiget et al. |

* cited by examiner

DEVICE FOR PROTECTION AGAINST ELECTROSTATIC DISCHARGES IN ELECTRONIC COMPONENTS

CROSS-REFERENCE TO RELATED APPLICATIONS

This application is a National Stage application based on an International Application filed under the Patent Cooperation Treaty PCT/EP2022/065392, filed Jun. 7, 2022, which claims priority to DE 10 2021 115 816.8, filed Jun. 18, 2021.

BACKGROUND OF THE INVENTION

The invention relates to a device for protection against electrostatic discharge in electric, electronic and optoelectronic components, in particular those which are present in the form of printed components. This relates, for example, to components from the field of flexible electronics, such as e.g. touch screens, multi-touch screens, touch sensors, capacitive buttons, capacitive touchpads, sliders, displays and other input and output devices which are touched by the user and comprise read-out electronics, circuits, in particular printed circuits, and/or sensors.

Electrostatic discharges—"ESD"—are voltage flashovers forming due to a large potential difference. These flashovers—possibly noticeable as sparks—cause a brief, high electric current and can lead to the ignition of flammable substances. In unfavorable circumstances, flashover hazards arise on the electronic component. Undesired consequences of electrostatic discharges are damage to electric components in devices, among which field-effect transistors are particularly affected.

The cause of the potential difference which leads to the electrostatic discharge (ESD) is usually charging due to static electricity. Static electricity occurs, for example, when walking on a carpeted floor. If the air humidity is below 20%, a person can be charged to up to 35,000 V. If the air humidity is above 65%, the possible charging drops below 1,500 V.

Almost all electric, electronic and optoelectronic components belong to the group of ESD-sensitive, "electrostatic discharge sensitive", components. The function of these components can be impaired or destroyed by electrostatic discharges. This relates in particular also to electronic, electric and/or optoelectronic components which represent input and output devices.

Electrostatic discharges cause damage to microelectronic, in particular printed, electronic components if they are not protected against this. This is in particular because, in proportion to the size of the component, the energy of a static discharge—e.g. due to touch—in an electronic component behaves like the energy of a lightning strike in a tree.

This becomes clear when ESD damage to a chip or a touch screen which has created a "crater" there is looked at under a microscope. Compared with a lightning bolt in nature, an electrostatic discharge has a very much smaller amount of charge and thus a much smaller stored electrical energy. However, the electric power which acts during the discharge must be considered.

As the discharge time can lie in the very short time range of ps to ns and the damage area or strike area of the discharge often lies in the range of around 5 μm to 10 μm, a very high electric power and a very high power density—power per surface area—occurs in the component despite the relatively low electrical energy. As discharges can only be felt at all from approx. 2,000 V, measures need to be taken to reliably prevent charging up through touching—in particular in the case of touch screens.

Here, a touch screen is described as an example of an electronic component to be protected, which can be realized for example in the form of printed electronics. By "touch screen" is meant here a touch screen which is a combined input and output device, wherein the program sequence of a technical device, usually a computer, can be directly controlled by touching parts of an image. The technical implementation of the command input is invisible to the user and thus creates the impression of directly controlling a computer by pointing. Many touches thus take place and the danger of ESD is great.

In the structure, the touch screen advantageously comprises at least one protective layer protecting against environmental damage in the form of an encapsulation. This protective layer is preferably applied over the whole surface, in particular for economic reasons. Under the protective layer, and protected by it, lies an input field with at least one layer electrode, which may possibly rest on a substrate if it is not designed self-supporting. The substrate and/or the protective layer are formed as films, in particular plastic films, or of thin glass, for example. Protective layer and/or substrate are preferably formed of materials with a high dielectric strength. The core of the touch screen is the so-called "ESD-sensitive area", the one or more layer electrodes—in the case of several stacked layer electrodes there are at least partially isolating layers—so-called dielectrics—in between so that a short circuit does not occur—which display the inputs and outputs and are connected to a computer unit via a controller. The layer electrode(s) is/are electrically conductive and structured layers with input and output fields, conductors and electrical contacts.

An electrostatic discharge (ESD) could completely or partially destroy the read-out electronics, the circuits, the conductors, the contacts, the input and output fields and/or the sensors because the electrical conductors and electronic components provided there cannot dissipate high electric power densities.

Until now, the sensitive parts of the electronic component have been protected against electrostatic discharges by at least one suitable protective layer with high dielectric strength, advantageously flanked by at least one ESD-dissipative structure, which acts in a similar way to lightning conductors and serves to safely dissipate discharges occurring in spite of the protective layer.

These dissipative structures are preferably made of electrically very conductive material, e.g. material with a conductivity greater than/equal to that of steel, such as e.g. metal alloys with gold, aluminum, copper or silver and/or these metals by themselves or correspondingly processed metal pastes, which are printable. The dissipative structure is created, for example, such that it has enough capacitance to dissipate a discharge without itself being damaged. The dissipative structures are located, e.g., in the non-transparent area of the component such that the dissipative structures preferably comprise conductors and/or conductor paths in dimensions which are no longer transparent to the human eye.

The dissipative structure(s) is/are advantageously guided on the same ply as the layer electrode(s) and—completely or partially—around the ESD-sensitive areas of an electronic component and connected to a ground potential—preferably at low impedance. The dissipative structure(s) can completely or partially surround the sensitive areas. If an electrostatic discharge occurs in this area, it strikes the ESD-dissipative structure and is dissipated via it without damaging the ESD-sensitive area(s).

In order to satisfy this function, according to the state of the art it is ensured that the electrostatic discharge (ESD) strikes the dissipative structure and not the sensitive area by arranging the dissipative structure at a discharge-sensitive point, for example adjacent to the "on/off" button. However, that is not enough because the discharge often strikes somewhere on the protective layer because it creeps along on the surface protective layer.

SUMMARY OF THE INVENTION

The object of the present invention is therefore to overcome the disadvantages of the state of the art and in particular to provide a structure for an electric, electronic and/or optoelectronic component with a protective layer, in particular a protective layer applied over the whole surface, and a dissipative structure, which provides an improved protection against electrostatic discharges.

This object is achieved by the subject-matter of the present invention as it is disclosed in the description, the figures and the claims.

Accordingly, the subject-matter of the present invention is an electric, electronic and/or optoelectronic component with at least one dissipative structure, which is suitable for dissipating electrostatic discharges, at least one layer electrode with a conductive structure, which represents an area sensitive to an electrostatic discharge, and at least one protective layer applied over the whole surface, which covers both the layer electrode and the dissipative structure, arranged in such a way that the sensitive area and the dissipative structure are present electrically isolated from one another and the sensitive area is encapsulated with respect to the environment, wherein the protective layer has means, on top of the dissipative structure and/or to the side thereof, by which an electrostatic discharge is directed on the surface of the protective layer toward the dissipative structure.

"Means for directing the electrostatic discharge" denotes for example a discontinuity in the protective layer installed in a targeted manner and/or a targeted—at least partial—removal of the protective layer. A "gap" thereby forms in the protective layer, which for one thing can form an indentation, and for another can form a hole. Both the indentation and the hole can be completely or partially refilled. The filling can be both electrically conductive and not electrically conductive. The gap can have any desired shape at all—above all seen from above—circle, ellipse, dash, dot, triangle, etc.

Through the targeted removal, an indentation—for example—can be created in the protective layer, which is characterized by the fact that material of the protective layer is removed at different depths, but not continuously through the protective layer. Such an indentation can be regarded as a structure which can be filled with any desired filling to any desired height.

"Filling" denotes here a closure of the gap formed through the removal of the protective layer. The filling can completely or partially close the gap. Moreover, from the point of view of the material, the filling can be designed electrically conductive or electrically isolating. Even if the filling refills a "gap" in the protective layer with material that is the same as the protective layer, a discontinuity still remains there, which is suitable for directing an electrostatic discharge to this point on the surface of the protective layer.

The targeted, partial removal of the protective layer results—as mentioned—in an indentation in the protective layer, for example, which still represents a continuous protection against the environment despite the indentation. On the other hand, the targeted, partial removal of the protective layer results—for example—in a complete hole, thus an open point in the protective layer passing through the protective layer. This can also be refilled, again with any desired material in any desired quantity.

In the present case, "sensitive area" denotes, for example, one or more layer electrodes which form the core of a component, and/or conductors, contacts, etc. The sensitive area preferably also comprises sensor fields, which can be used as input and/or output fields. It is preferred in particular here if at least some of these sensor fields are present in the form of PolyTC®.

The protective layer which forms the encapsulation of a component should have high dielectric strength. Ideally, such a protective layer has no discontinuity and is constructed completely homogeneous, but in the thinnest plies, which the protective layer, or encapsulation, forms, there are generally also extremely small contaminations sitting on the surface, which are discontinuities and naturally attract an electrostatic discharge. These discontinuities are unplanned, random and statistically occurring discontinuities, which are undesired because they direct an electrostatic discharge, if at all, only randomly to the dissipative structure.

The protective layer can comprise one or more plies, which in each case are made of the same or a different material, in a composite, such as a laminate. One or more plies can be made of a composite material filled with filler particles.

In other words, according to the state of the art, the case often arises that an electrostatic discharge is effectively stopped on the plastic surface of the protective layer but then creeps along on the surface of the protective layer as far as a discontinuity, into which it then strikes. Such a discontinuity can be caused by a contamination during the production, for example in the extruder. The effect is the same as in the case of a filler particle; the electrostatic discharge creeps along an undamaged surface of the protective layer as far as the discontinuity, where it then strikes. According to the current state of the art, this point on the protective layer cannot be predicted and, in the case of these unwanted discontinuities, will occur in extremely rare cases in the vicinity of the dissipative structure.

A general finding of the invention is that—because it cannot be produced completely protected against impurities—a protective layer as a rule may possibly attract the electrostatic discharge and thus predetermine the location of the strike point. Until now, this has led to uncontrollable damage because the position of an individual dirt particle within the protective layer cannot be predicted.

Therefore, as a means that is suitable by way of example for directing the electrostatic discharge, it is provided that one or more discontinuities—e.g. in the form of filled or unfilled gaps—are incorporated in the protective layer in a targeted manner by deliberately creating, in the protective layer on top of and/or in the immediate vicinity of the dissipative structure, one or more discontinuities in the form of one or more weak points and/or filled points, which effectively directs an electrostatic discharge to this/these points on the protective layer and thus the electrostatic discharge is made safe by the dissipative structure for the component protected in this way.

One possibility for directing the electrostatic discharge toward the dissipative structure is naturally simply to provide the protective layer with a corresponding hole at that point. As the dissipative structure is a good conductor—exposed—it would attract the electrostatic discharge without problems. However, this "means for directing" is not preferably used because the protective layer represents not only a protection against electrostatic discharges but also against environmental influences generally, therefore exposed ESD-dissipative structures and thus exposed layer electrodes within the component are susceptible to mechanical damage, e.g. during the integration of the component in a larger device, air, moisture, etc.

Therefore, and also in order to prevent damage by corrosion, oxidation or other chemical attacks on the layer electrode(s) of the component, it is not very advantageous simply to leave the protective layer open on top of the dissipative structure. This is all the more the case because the protective layer can preferably, and generally only, be applied over the whole surface and therefore exposing the dissipative structure by omitting the protective layer on top of the dissipative structure is hardly possible in terms of process technology.

BRIEF DESCRIPTION OF THE DRAWINGS

The invention will be explained in more detail below with reference to 17 figures, which show various exemplary embodiments of the invention.

Figure 4:
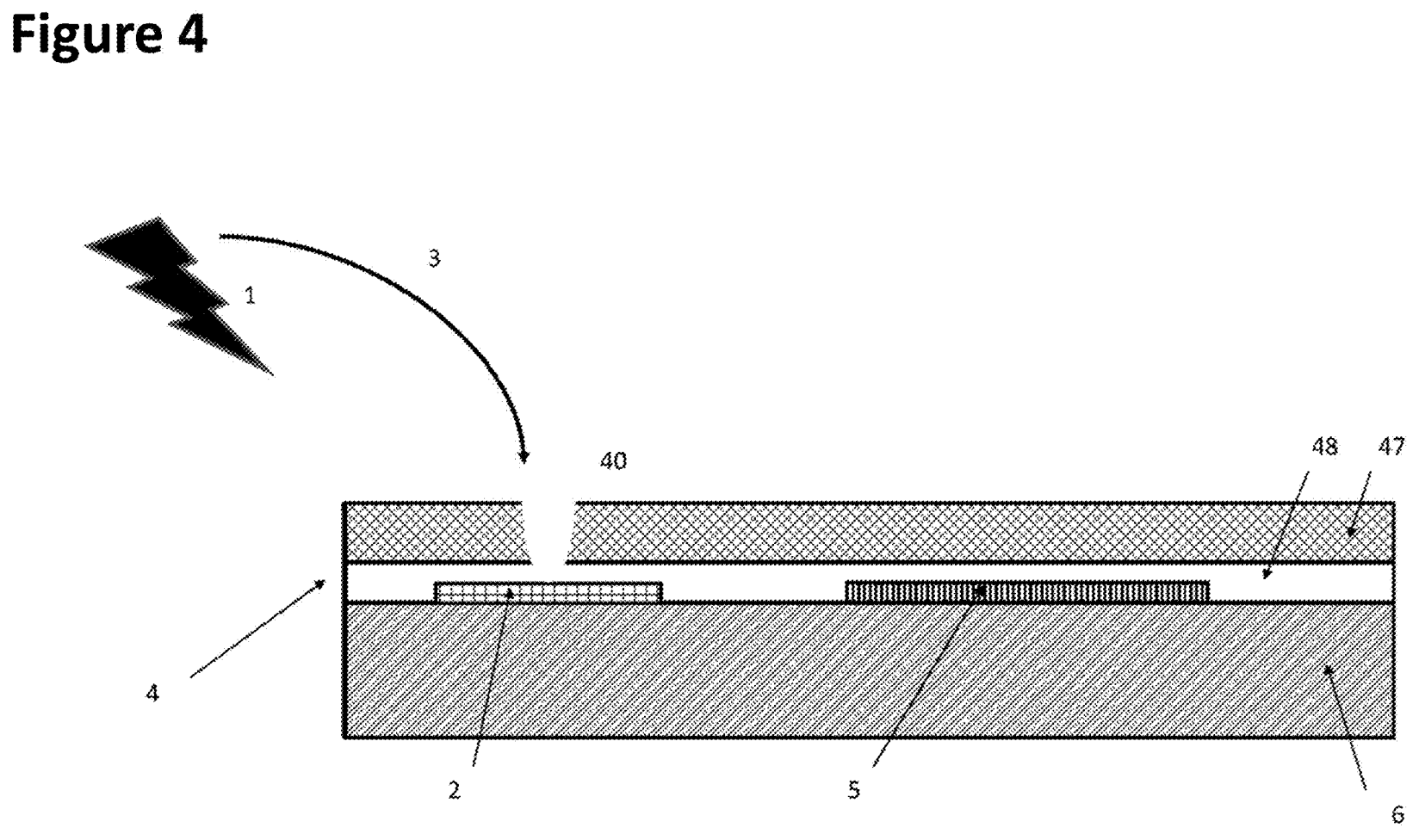

FIGS. 1, 3 to 8, 12, 13 show a part of an electronic, electric and/or optoelectronic component in cross section, whereas

DETAILED DESCRIPTION

Figure 1:
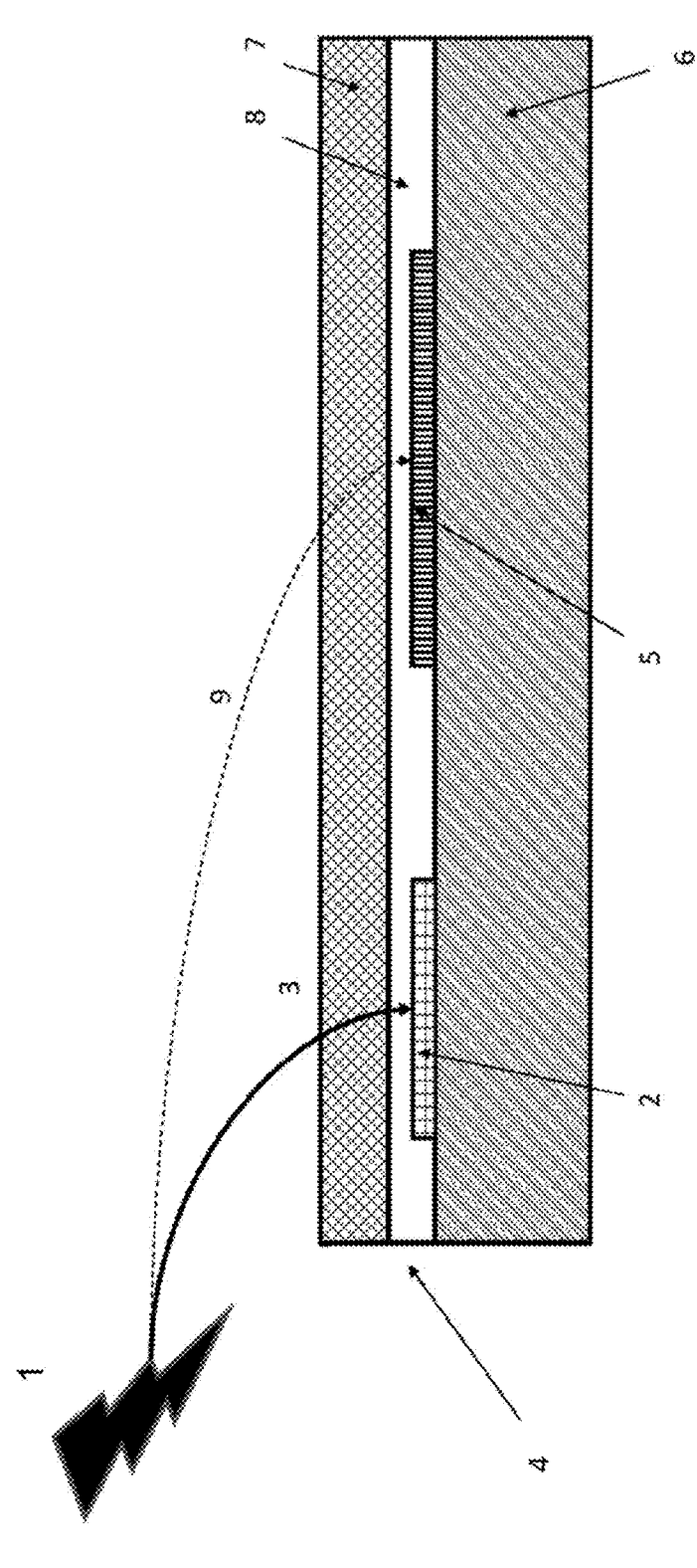

FIG. 1 shows the state of the art in the form of a conventional structure of a typical component in cross section with the disadvantage that, as stated in more detail above, time and again electrostatic discharges due to the lightning bolt 1 occur on the layer electrode 5 via an undesired strike path 9 and there result in destruction or at least in damage. In contrast, the discharge via the desired strike path 3 leads to the dissipative structure 2, which is designed such that it can dissipate electrostatic discharges 1 without appreciable damage to the component.

It is shown in FIG. 1 how an electrostatic discharge 1 can strike both the dissipative structure 2 and the layer electrode 5. The component shown, which is encapsulated and protected by a protective layer 7, comprises, as conductive structures, for one thing the only schematically indicated layer electrode 5, which forms the core of the component and at the same time the "sensitive area" and comprises the sensitive conductive structures and/or conductors, and for another the dissipative structure 2, which will be explained in more detail below with reference to various exemplary embodiments.

The protective layer 7 is an essential part of the structure of a component being discussed here. As stated, for economic reasons it is to be assumed in practical terms that it is applied over the whole surface over the layer electrode 5 as well as over the dissipative structure 2. This takes place for example via sputtering, printing, coating, vapor deposition, spin coating, plasma deposition, etc. The materials range from ceramic, glass-like, polymeric plastics, for example flat in the form of films, to ceramic metal oxides, such as aluminum oxides, silicon oxides, The protective layer can be formed as a multilayer or one-layer layer, thus for example as a laminate comprising one or more plies. The individual plies of a multilayer protective layer can be the same or different and have the same or different two-dimensional—areal—and/or three-dimensional—thus e.g. thickness—extent.

Here, the "layer electrode 5" is treated as a "black box" because, within the meaning of the invention, it can be quite different layer electrodes and/or conductors for optoelectronic, electronic or electric components, which are not discussed further here. Both the layer electrode 5 and the dissipative structure 2—unless they are designed self-supporting—lie on the substrate 6 and are, for example, embedded in a dielectric material 8, which in turn can be implemented, for example, as an adhesive that is usual for the production of layer bodies such as touch screens.

The protective layer 7 which lies over the dielectric material 8—which is not necessarily present in exemplary embodiments, however—preferably has a high dielectric strength. On the left in FIG. 1, in the component shown here, which can be produced—preferably in a continuous process suitable for mass production—by printing on a strip in various working steps, the product edge 4 can be seen, which forms during the cutting to length—thus when the component is "cut out" of the material of the components on the strip.

The substrate 6, to which the two conductive structured layers, the layer electrode 5 of the component and the dissipative structure 2, which is to protect the layer electrode from the electrostatic discharge 1, are applied, can be seen at the bottom in FIG. 1.

For example, according to FIG. 1 the electrostatic discharge 1 can strike at a discontinuity of the protective layer 7 above the layer electrode 5, as is illustrated by the undesired strike path 9, and damage the layer electrode 5. Such a discontinuity in the protective layer 7 can form, for example, due to extremely small contaminations. The electrostatic discharge 1 strikes the protective layer 7, which has a high dielectric strength, and does not pass through, but creeps along on the surface, seeks a discontinuity at which it can break through the protective layer 7 as far as a conducting structure—either the layer electrode 5 or as far as the dissipative structure 2.

According to the state of the art, as shown here in FIG. 1, such discontinuities are present completely unplanned anywhere on the protective layer 7, with the result that they are just as likely to be found above the layer electrode 5 as above the dissipative structure 2. Since the layer electrode 5 has a much greater extent underneath the protective layer 7 than the dissipative structure 2, the likelihood that a discontinuity above the layer electrode 5 is closest to the strike point of the electrostatic discharge is even much higher than that the discontinuity which the electrostatic discharge 1 seeks is above the dissipative structure 2.

Figure 2:
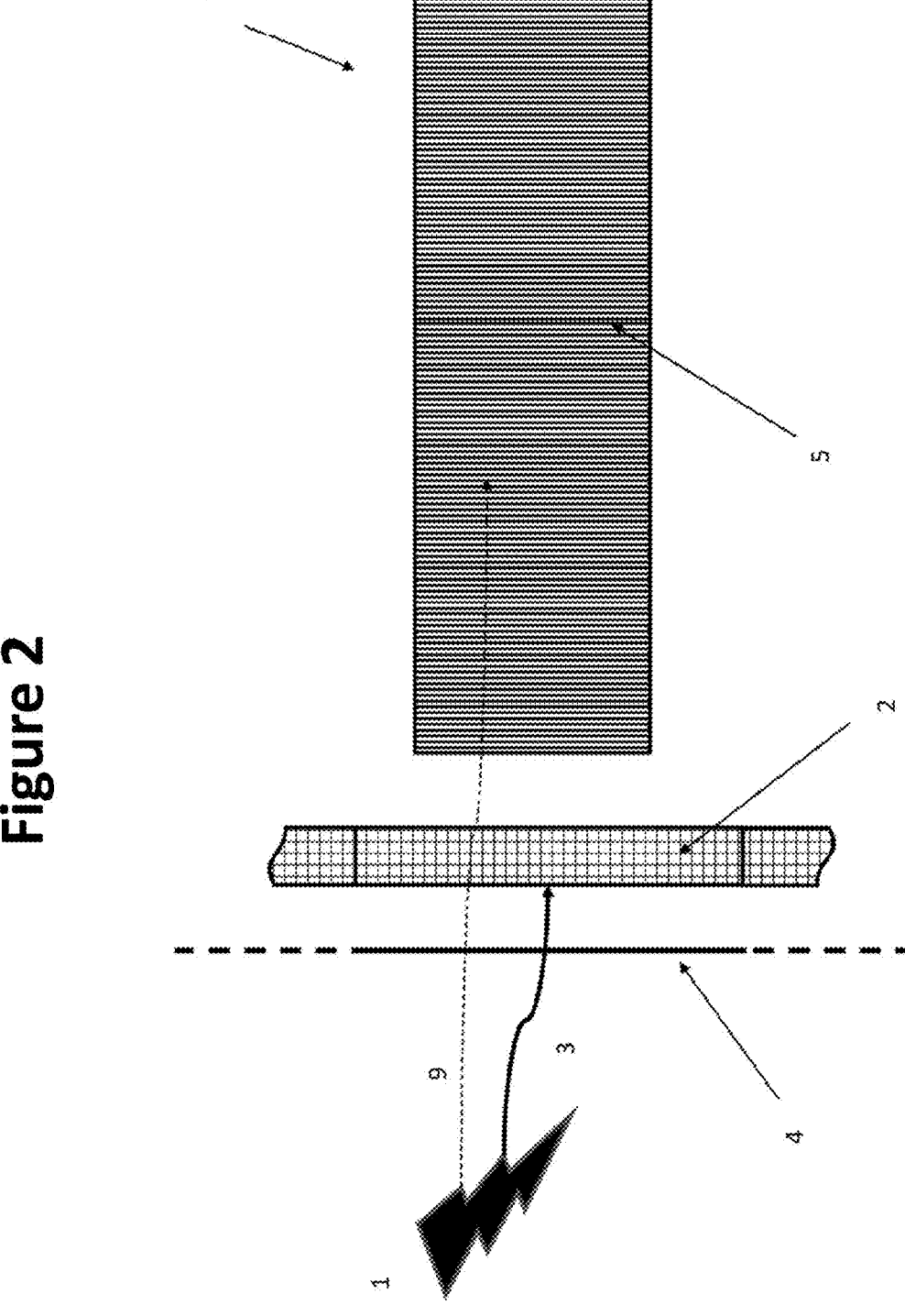
FIGS. 2, 9 to 11 and 14 to 17 represent a top view of a part of an electronic, electric and/or optoelectronic component.
Figure 3:
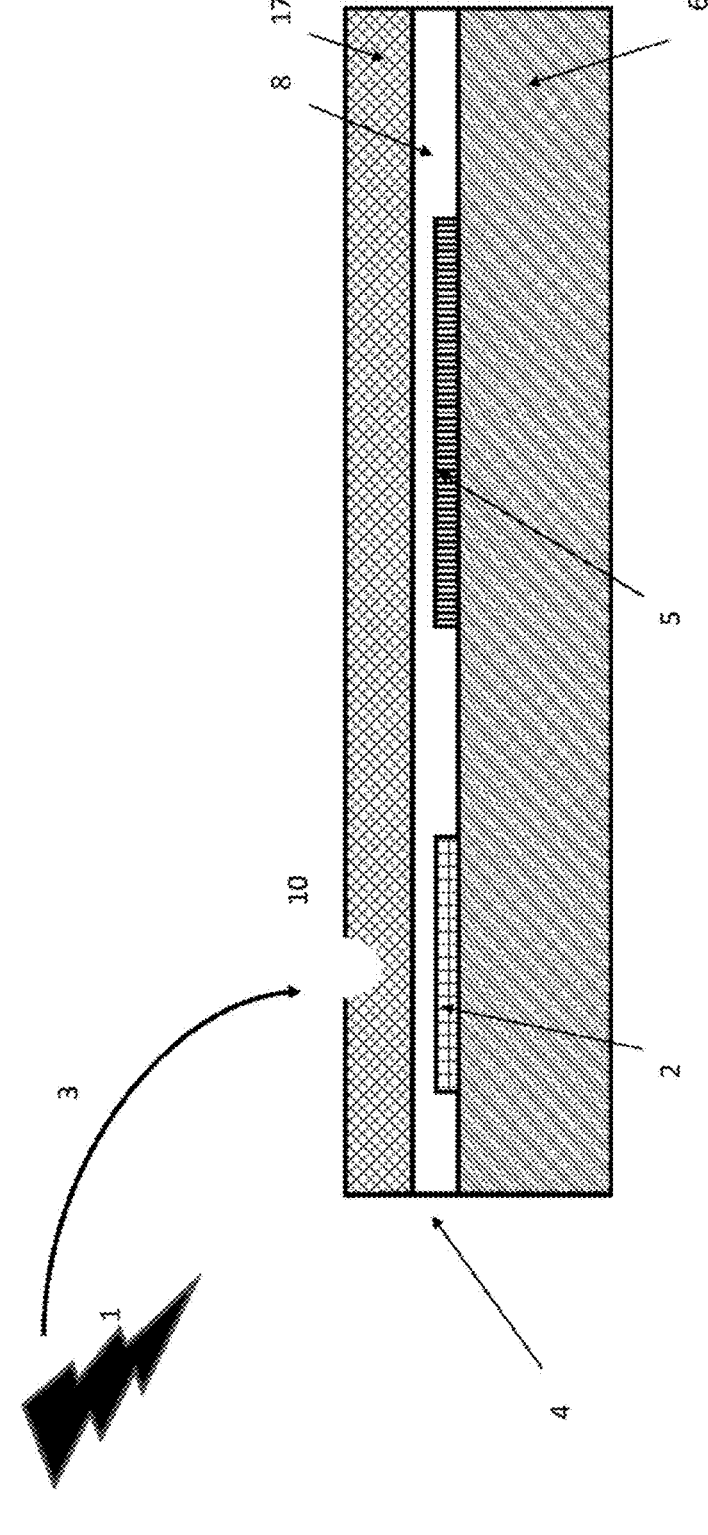
Figure 5:
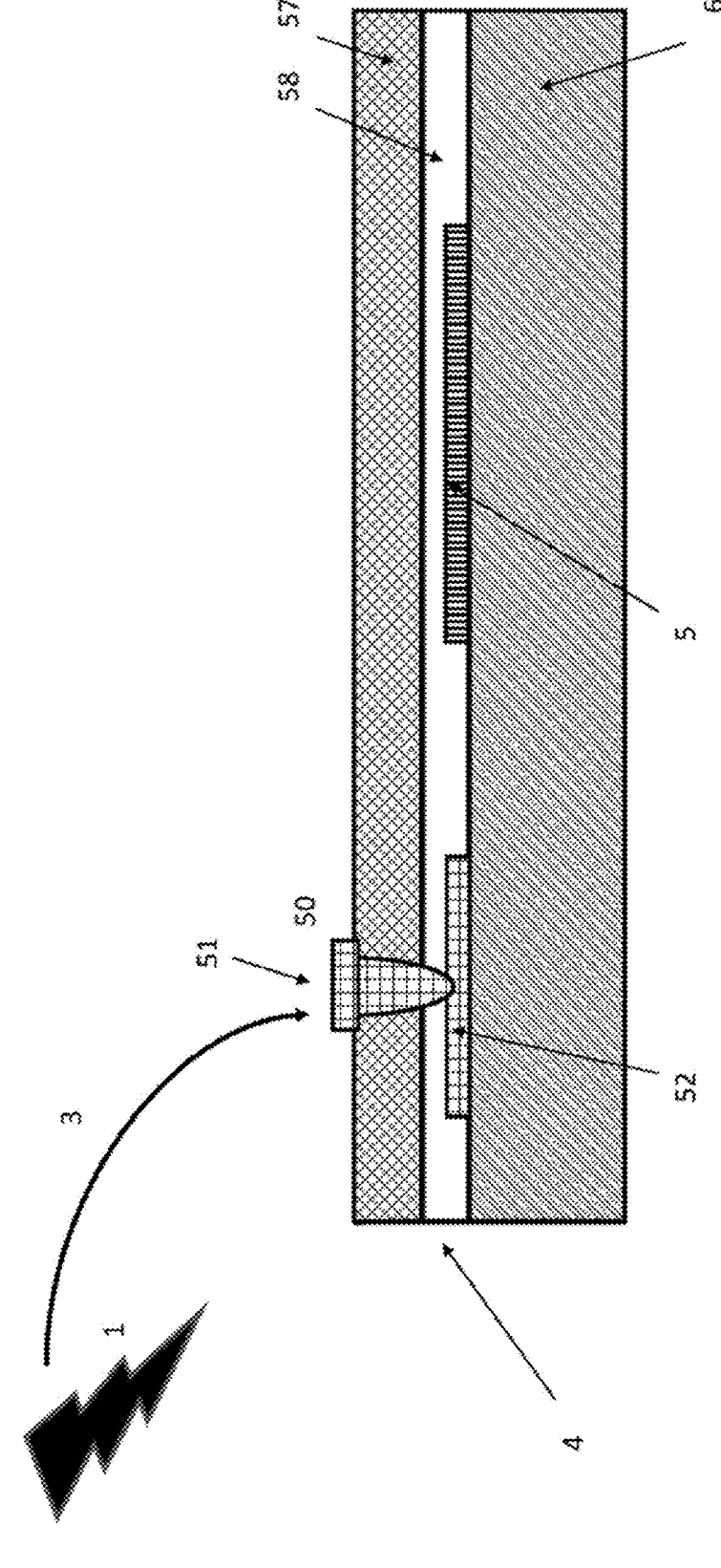
Figure 6:
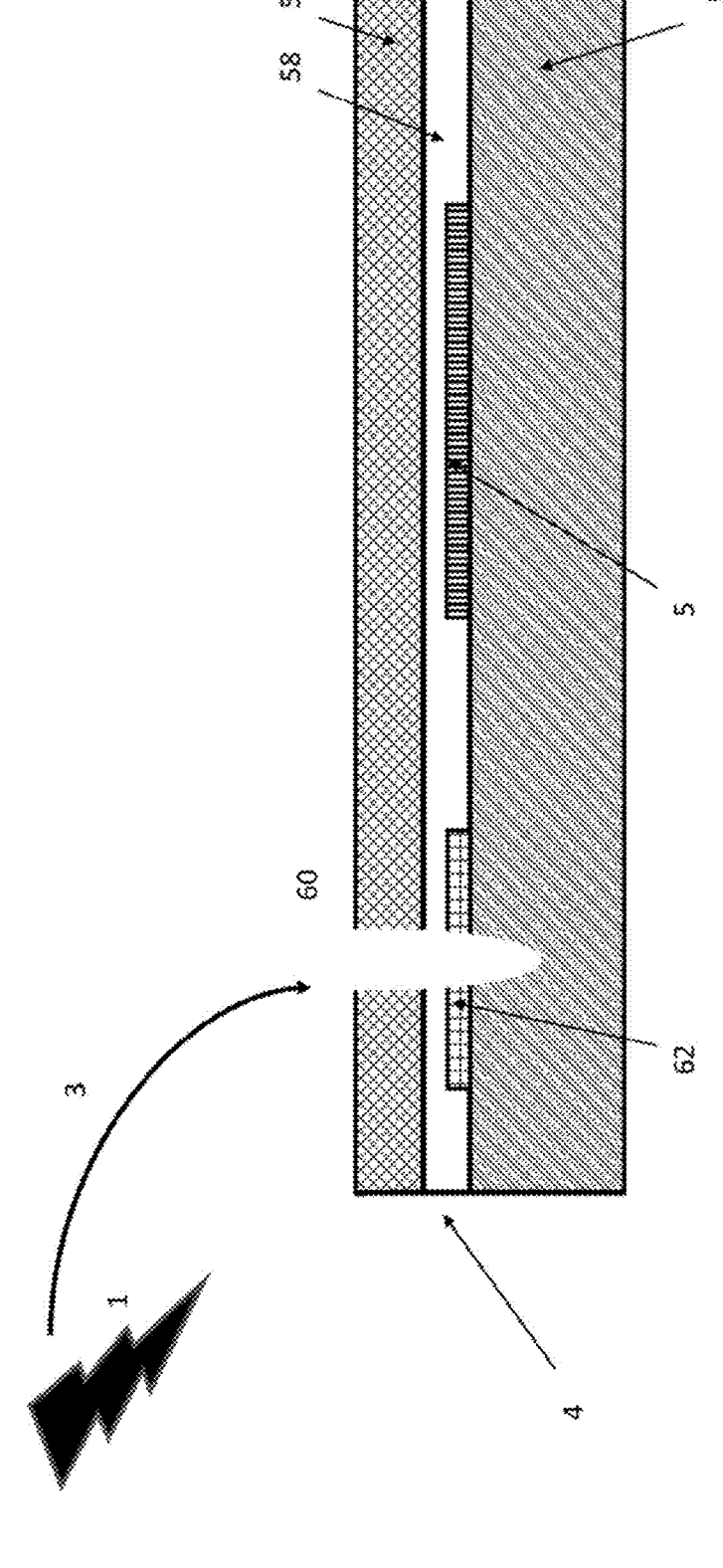
Figure 7:
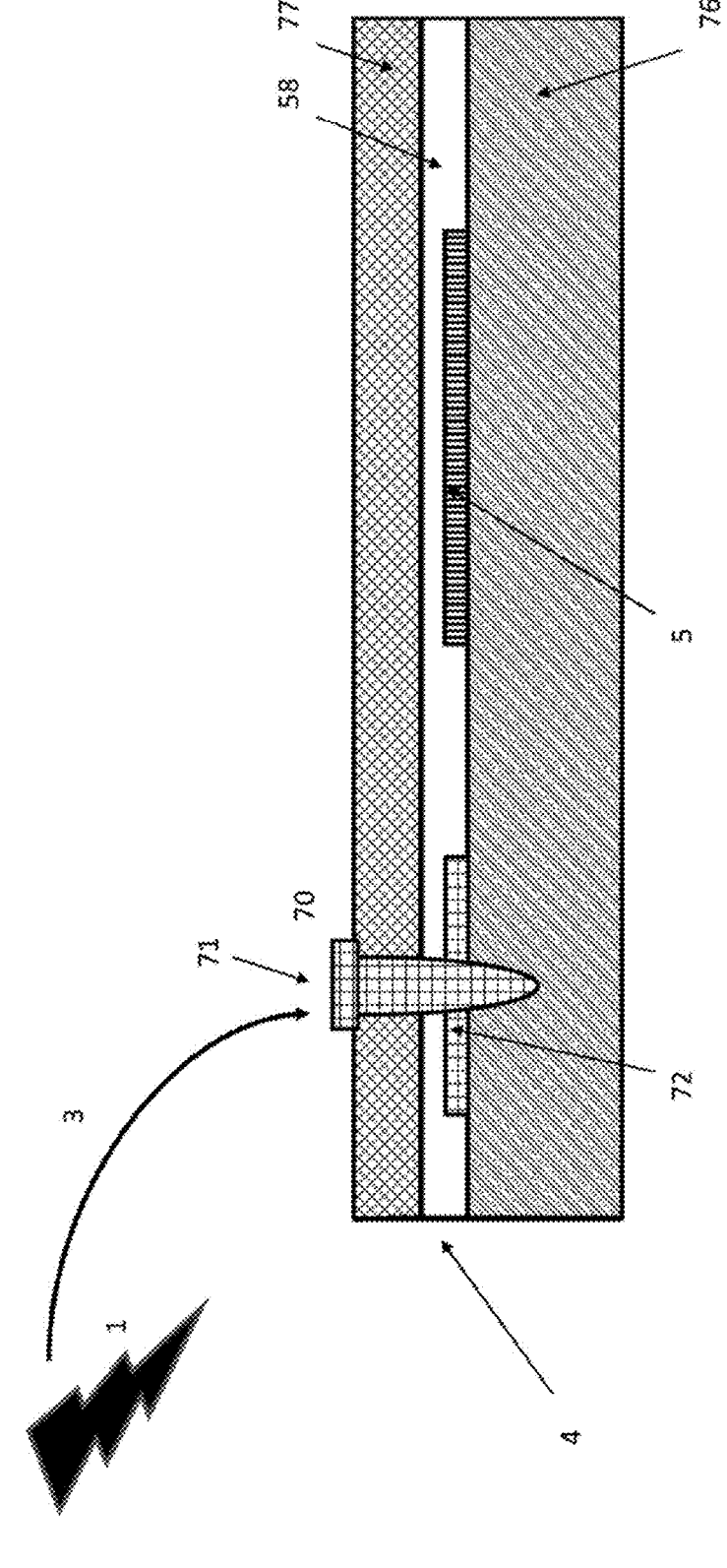
Figure 8:
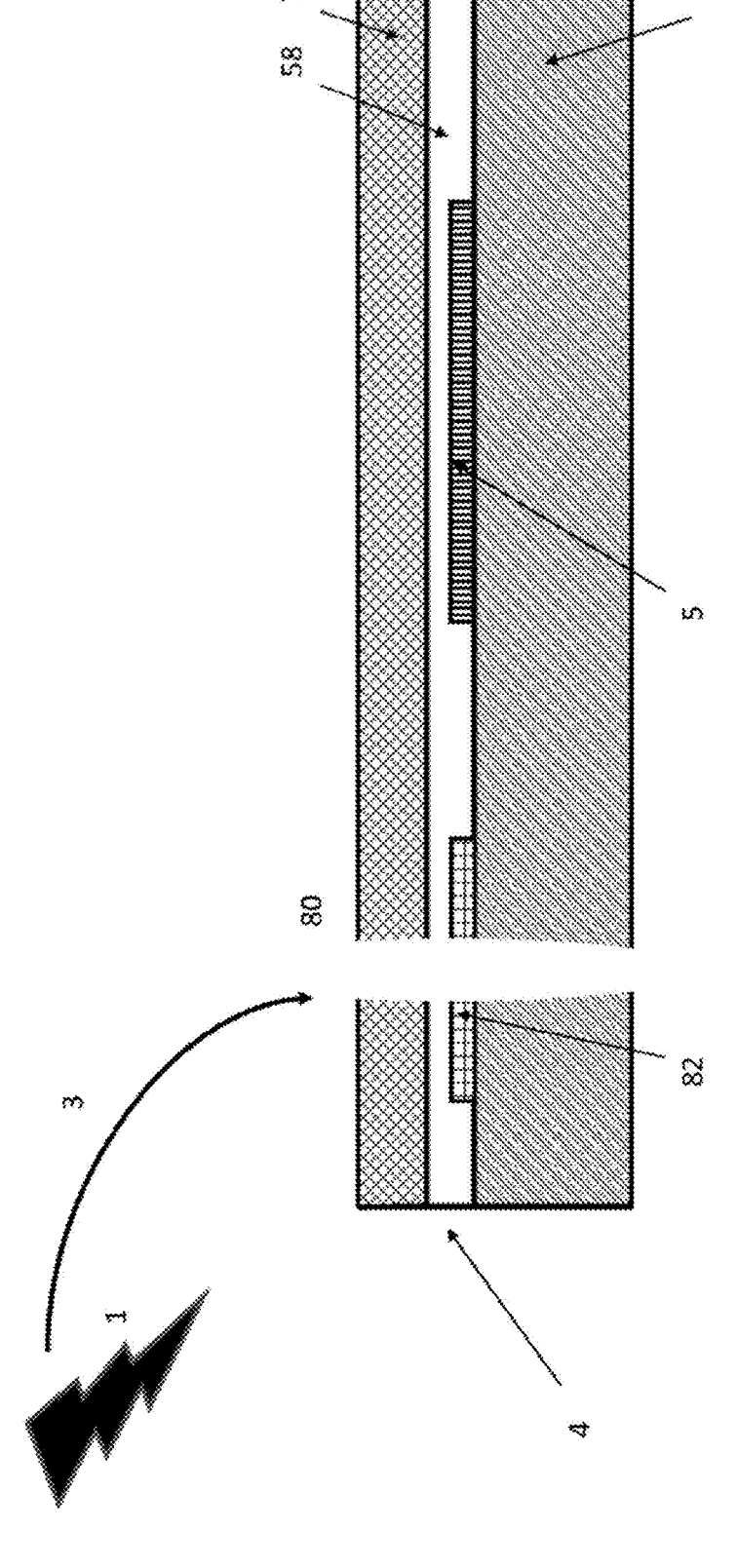
Figure 9:
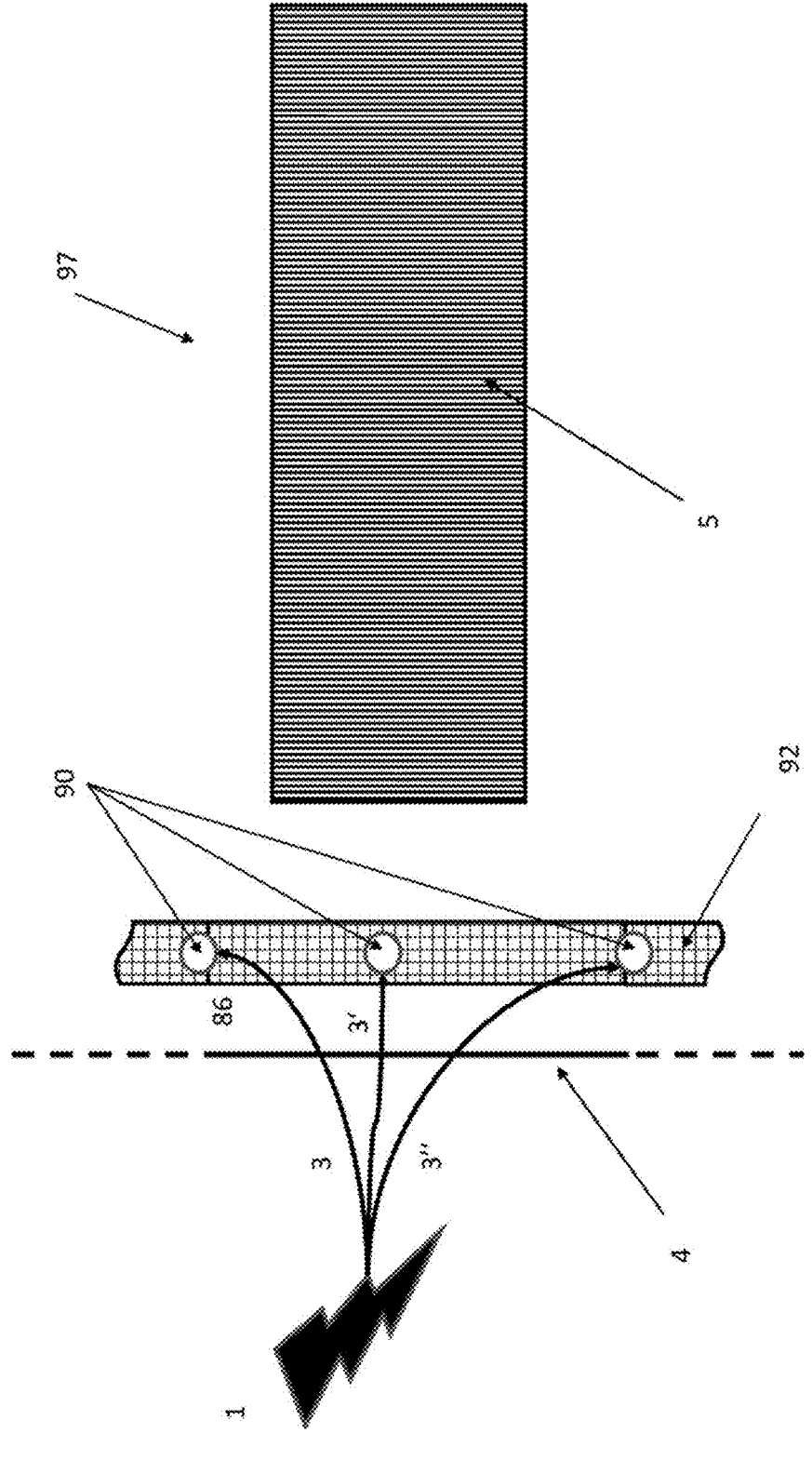
Figure 10:
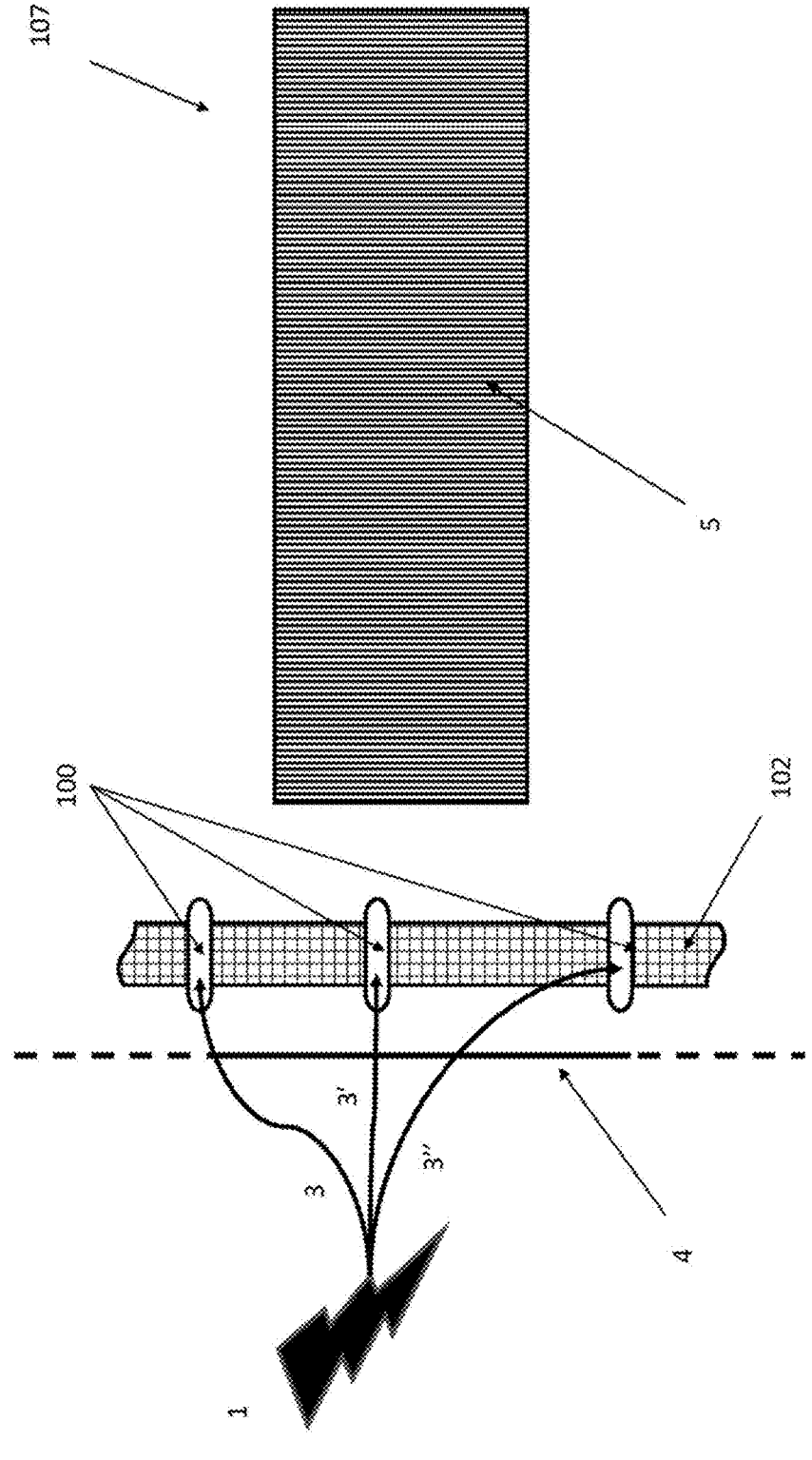
Figure 11:
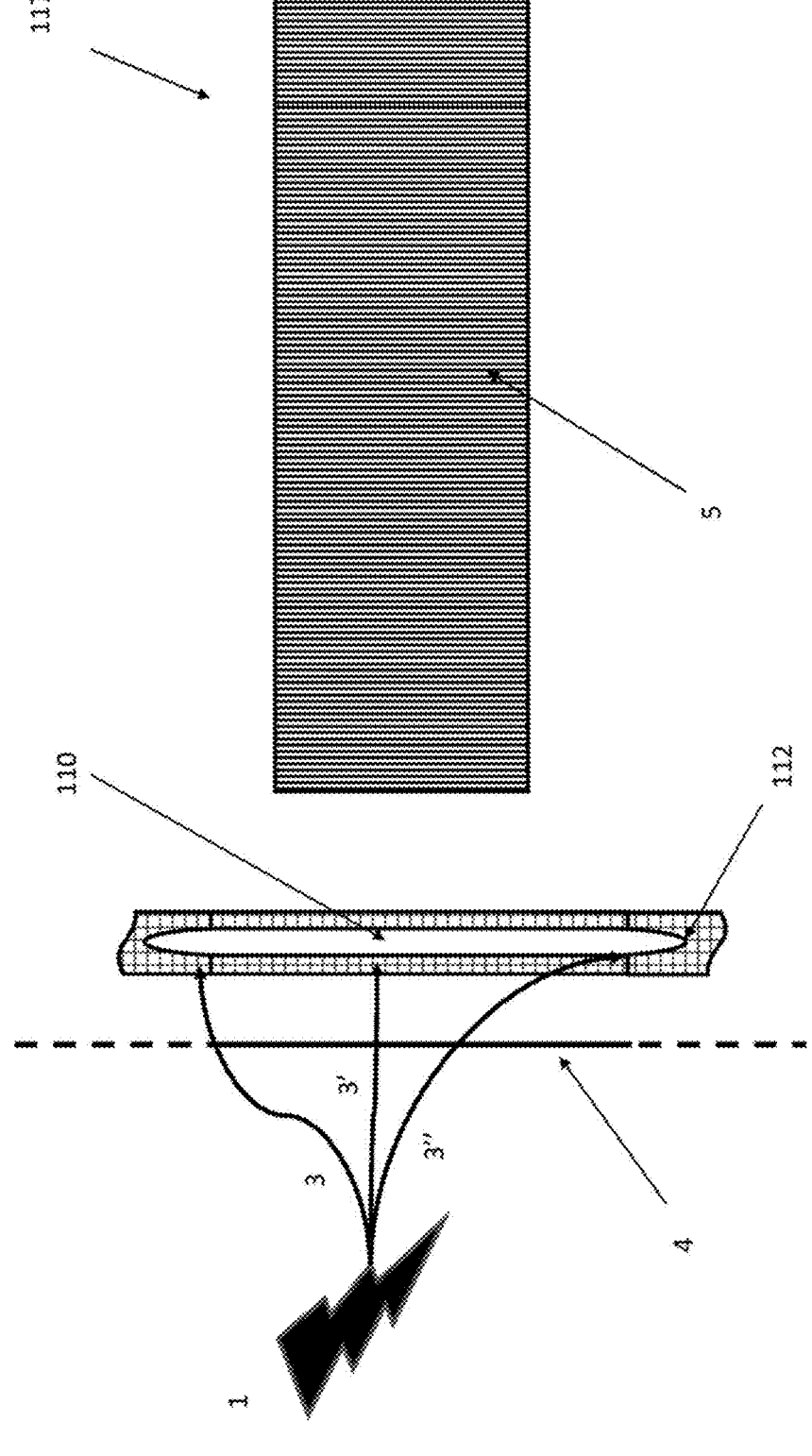

FIG. 2 shows exactly the same as FIG. 1 only this time in top view, through the protective film 7, which here is assumed to be see-through. Again, the layer electrode 5 is represented schematically as an outline, next to it the dissipative structure 2, as can be seen a great deal smaller in dimension, but naturally made of much more conductive material. The product edge 4 runs parallel to the dissipative structure 2, in the case of the production of the components in a continuous process on a continuous strip, strip direction vertical here, thus e.g. from bottom to top, likewise represented without a boundary in the strip direction, just like the dissipative structure 2.

From the hatching of the conductive surface areas in the area of the dissipative structure 2 on the one hand and of the layer electrode 5 on the other hand, a schematically represented difference in conductivity between the materials which are used in the area of the dissipative structures 2 and the materials which are used in the area of the layer electrode 5 can be seen.

As already mentioned, the material of the dissipative structure 2 is more conductive, less transparent and applied thicker and wider than the conductive structures of the layer electrode, which can comprise extremely fine conductor paths, some of which are formed so thin that they appear transparent to the human eye. For example, U.S. Pat. No. 9,513,758 B2 "electrical functional layer construction, production method and use thereof" discloses a layer electrode which could be used here as layer electrode 5. The dimensions specified there for the values specified non-transparent conductor paths start, in the lower range, from a thickness in the range below 10 nm.

In particular, the layer electrode 5 can be formed as a "metal mesh", which is commercially available e.g. under the trade name PolyTC®.

In particular, it is provided here that the layer electrode 5 comprises non-transparent conductor paths—made, for example, from conductive silver, carbon black, copper as well as any desired alloys and/or electrically conductive pastes—which have a thickness in the range of from 2 nm to 5 μm and are arranged parallel to the surface of the substrate such that a conductor path spacing is realized which guarantees areal conductivity at the same time as transparency for the human eye.

The width of these conductor paths lies, for example, in the range of between 1 μm and 40 μm. The spacings between these conductor paths lie, for example, in the range of between 10 μm and 5 mm.

A bundle or a grid of conductor paths preferably forms a segment, wherein the width and/or length of a segment lies, for example, in the range of from 500 μm to 15 mm.

There are always several segments, which form electrode arrays. A segment spacing lies, for example, in the range of from 10 μm to 2 mm so that short circuits are avoided.

The electrostatic discharges are so damaging for the conductive structures of the layer electrode 5 because they simply cannot transport this amount of electric power away, whereas a dissipative structure is a robust conductor, for example made of metal with good conductivity, which easily dissipates an electrostatic discharge without being damaged.

FIG. 12 again shows a cross section through a component. The dashed line on the left again shows the product edge 124. In the case of the production in a continuous method, the components are produced by printing on a continuous strip, for example. After finishing, the individual components are cut out of the continuous strip; this product edge 124 then forms during the cutting.

Cutting is done by lasering, for example.

In any case, waste can be seen to the left of the product edge 124 represented dashed, while the component, thus the product, can be seen to the right of it. In comparison with a similar view which shows the state of the art, e.g. FIG. 1, in this embodiment the dissipative structure 122 extends as far as the lateral strip end, thus in each case as far as the product edge 124. Once the cutting to length has been effected, thus for example cutting the product—see FIG. 13—this product edge 134 is exposed.

The cutting to length, as indicated dashed in FIGS. 2, 9 to 11 and 14 to 17, shown in top view, can be effected by cutting, e.g. roller cutting, lasering, punching and the like, as is well-known in the art in printing technology.

Figure 13:
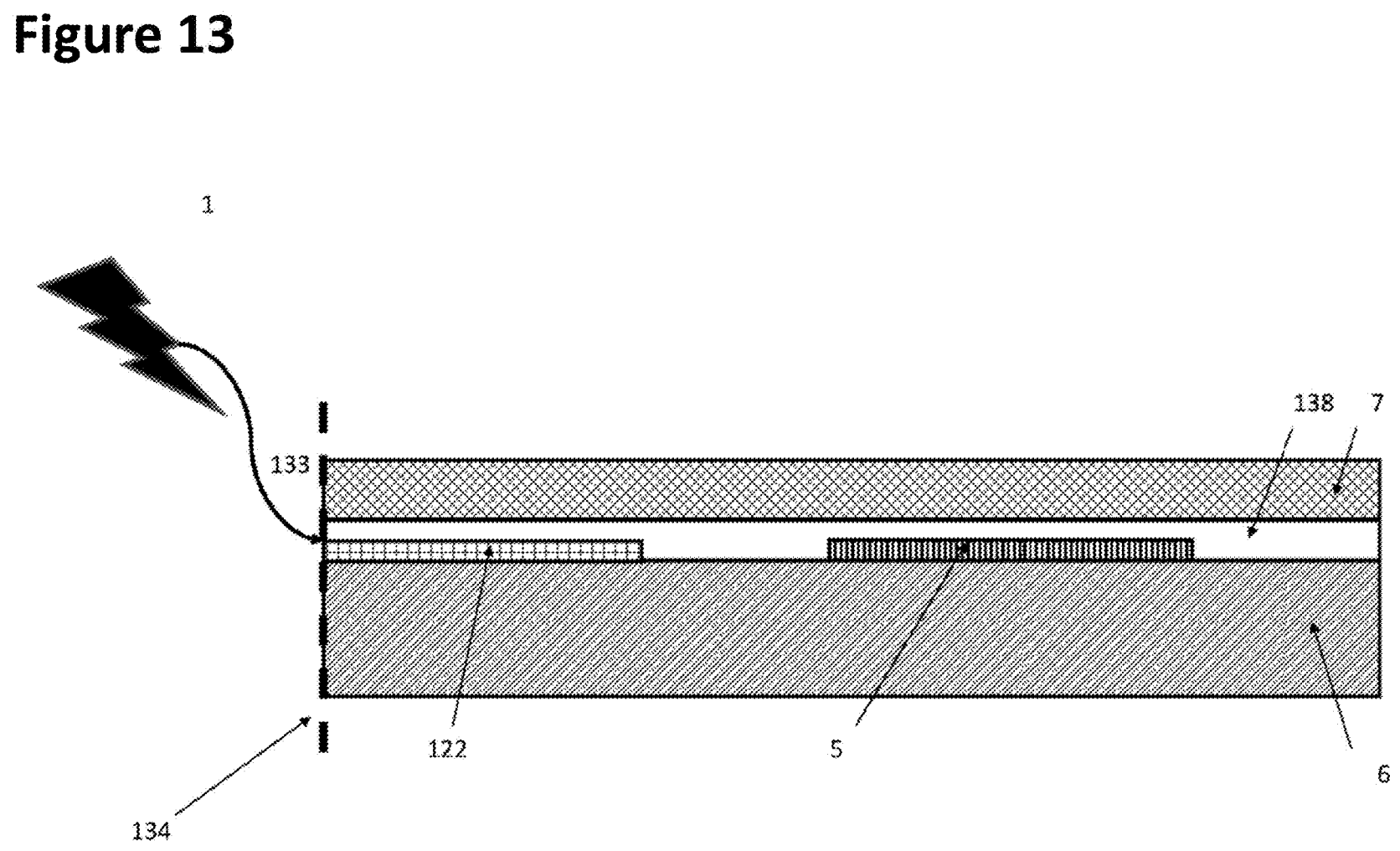

Because the dissipative structure 122 extends as far as the product edge 134, it is also exposed by cutting the product, with the result that an electrostatic discharge 1 strikes directly into the dissipative structure 122 at the product edge 134, thus at the side of the component, as the arrow 133 of FIG. 13 illustrates. In this case, the "means for directing an electrostatic discharge" is simply the exposed side of the dissipative structure 122 drawn out as far as the product edge 134. The dielectric material 138 completes the encapsulation of the component by the protective layer, in particular for protecting the layer electrode 5 from damaging environmental influences, such as air, moisture, etc.

Figure 12:
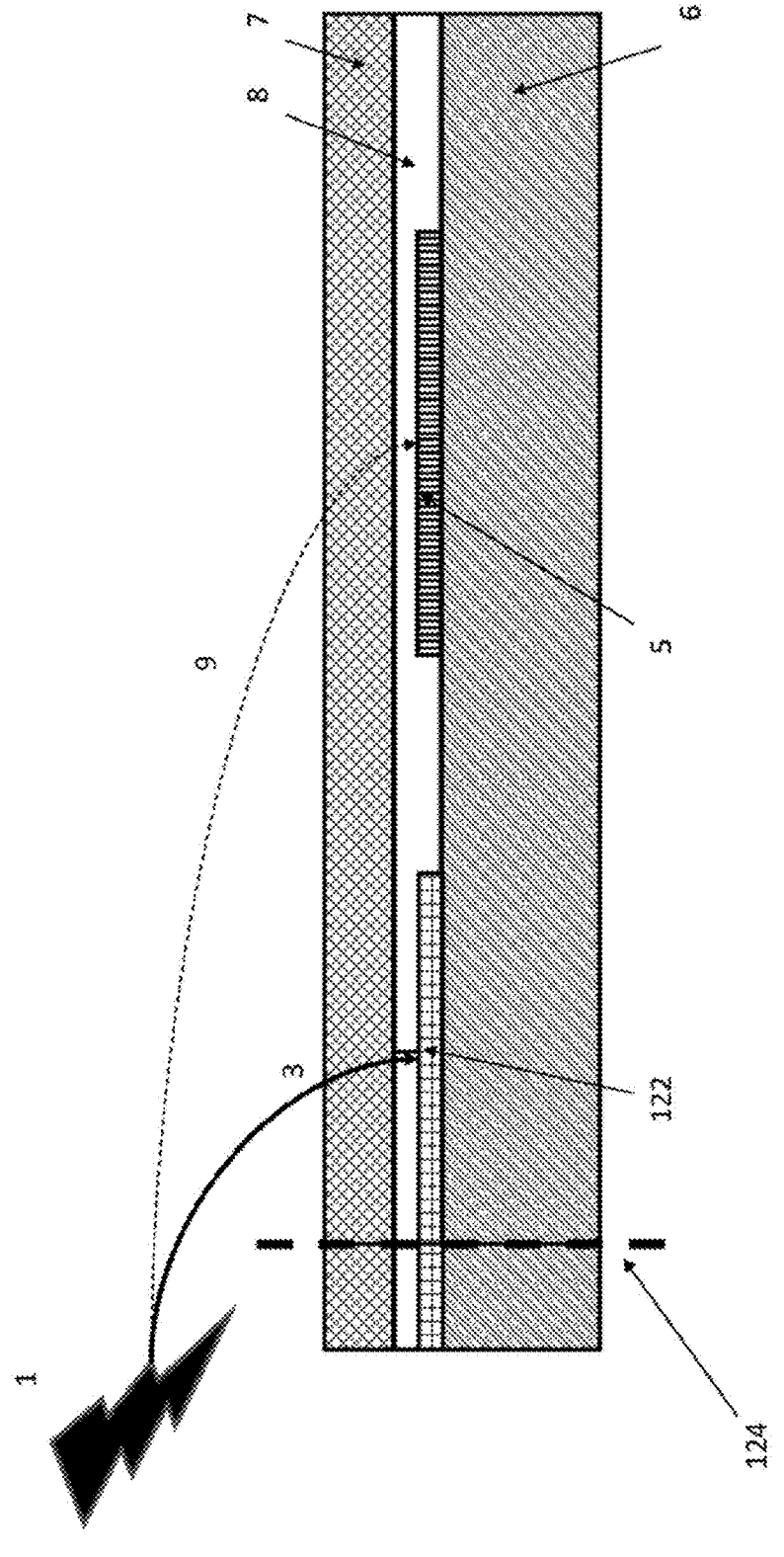
Figure 14:
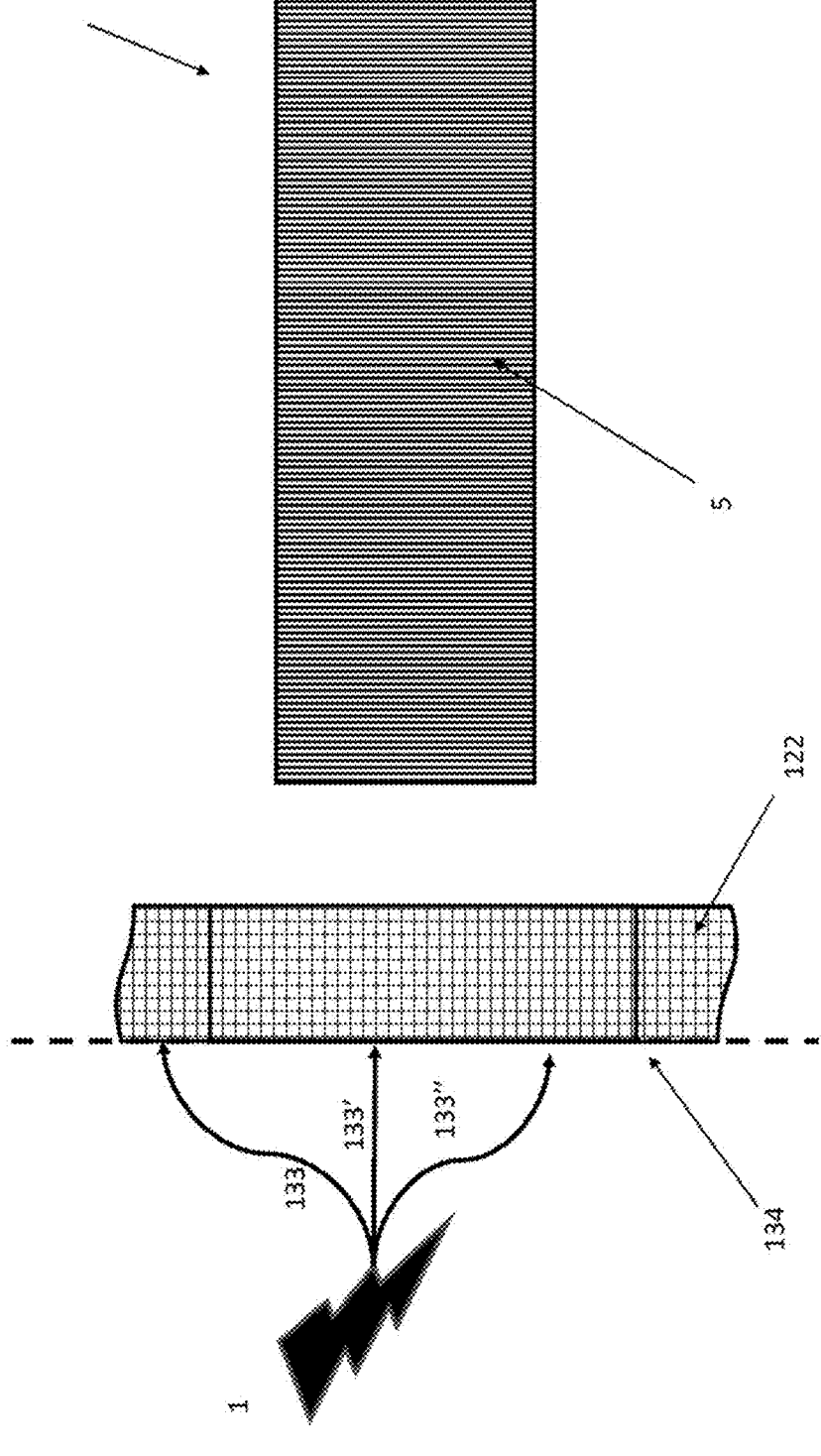

FIG. 14 shows the embodiment of FIGS. 12 and 13 once more in top view. Again, the product edge 134, into which the electrostatic discharge 1 strikes according to 133, 133' and 133", as well as the dissipative structure 122, which extends as far as the edge, is to be seen.

Figure 15:
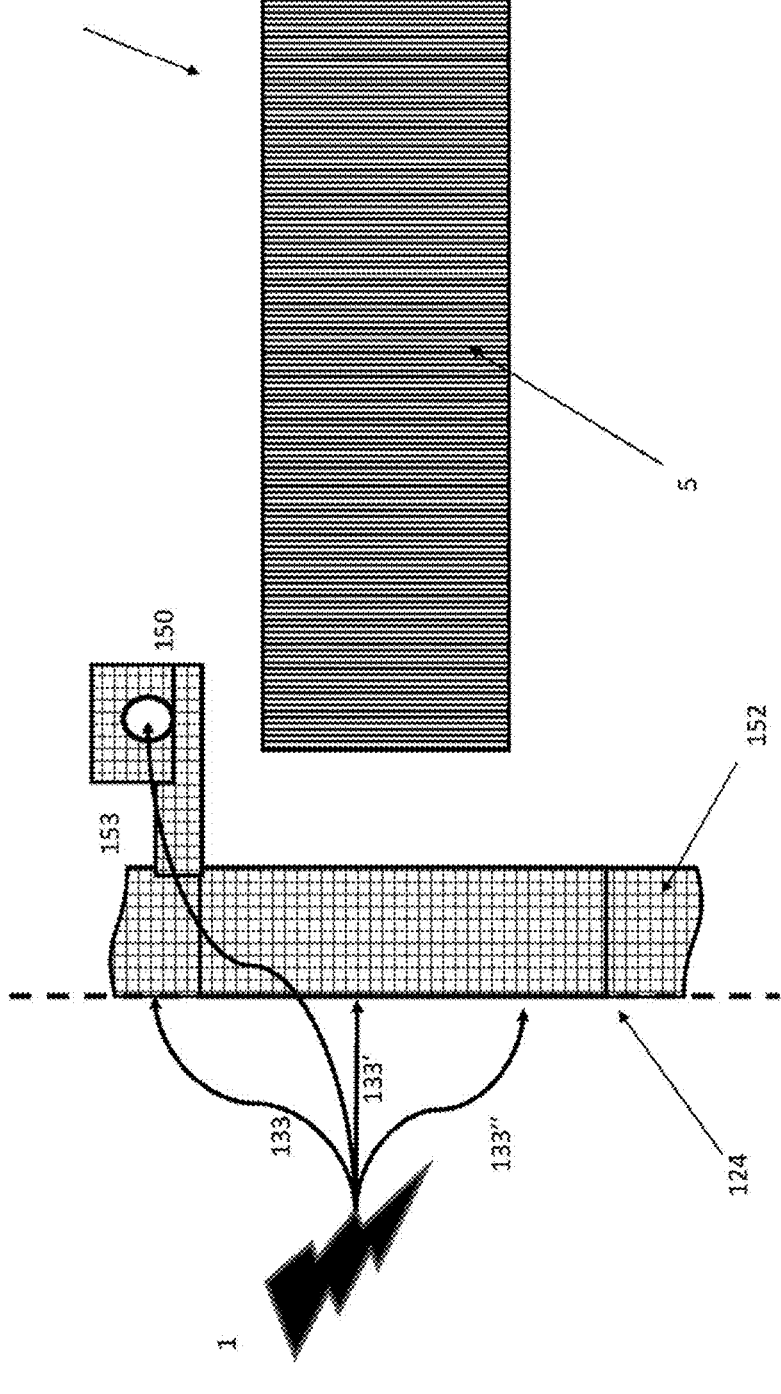

FIG. 15 shows, in a top view, a variation of this embodiment example with a dissipative structure 152, which for one thing is exposed at the side so that it directs and dissipates an electrostatic discharge 1 there, but also additionally has targeted discontinuities 150, which are placed in a targeted manner at especially electrostatic discharge-sensitive points, for example. These discontinuities can, for example, be points for aligning the component on a larger device.

These discontinuities and generally the discontinuities used here as "means for directing an electrostatic discharge" either expose the dissipative structure at that point, with the result that an electrostatic discharge 1 creeping along at the surface "strikes" there and can be dissipated, or they are indentations or holes which are filled with conductive material, which contacts a dissipative structure, such that the electrostatic discharge strikes equally at these points.

Figure 16:
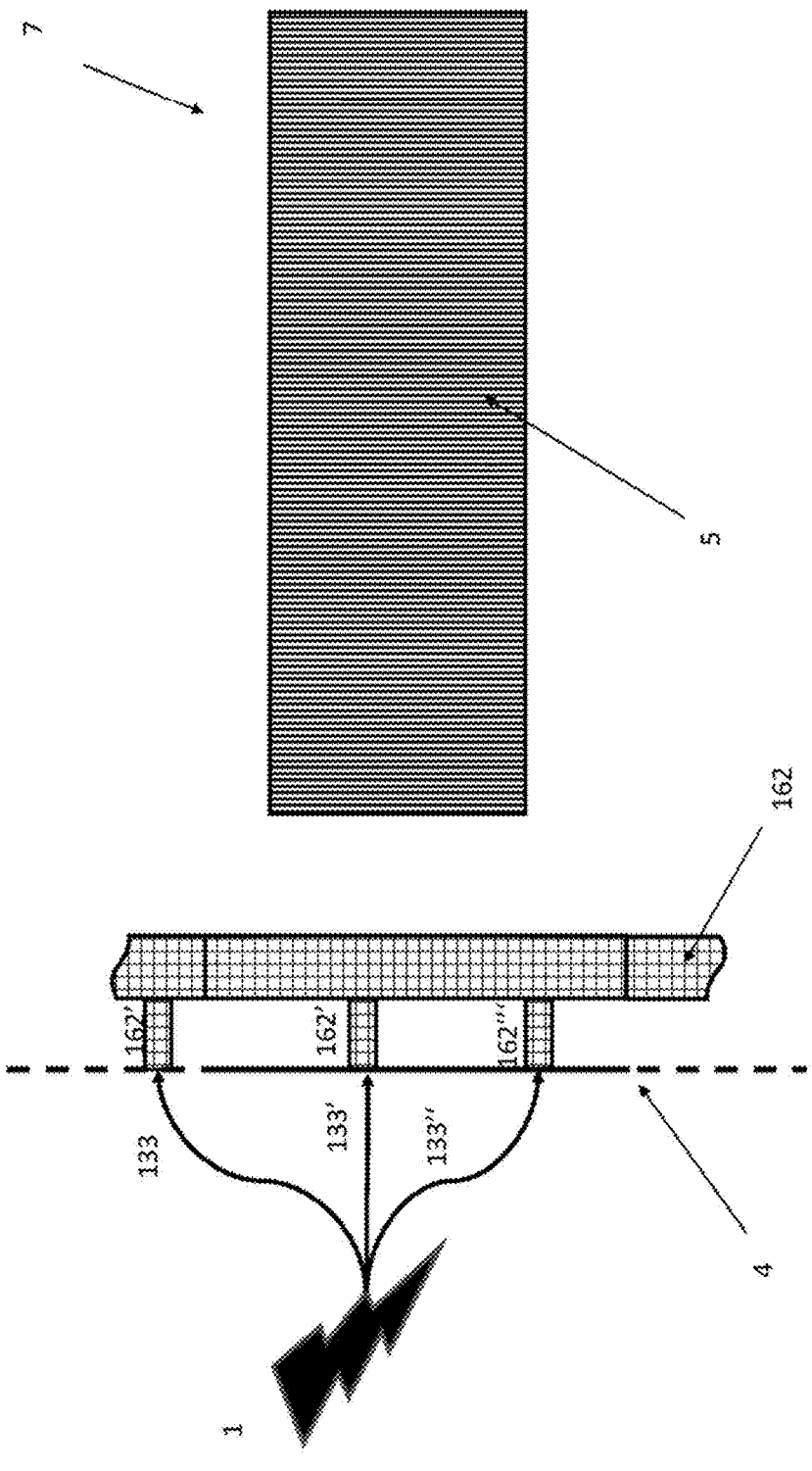

FIG. 16 once more shows another variant of the directing of an electrostatic discharge at the side of the product edge 4. As can be easily seen in the top view in FIG. 16, the entire length of the dissipative structure 162 is not extended toward the product edge but only bridges 162', 162" and 162''' at regular spacings struck the product edge 4. Naturally, this variation can also be realized with irregular spacings of the bridges. This variant can again just as well be used combined with other variants.

In the variant shown in FIG. 16 it is again also assumed that an electrostatic discharge 1 is directed to one of the lateral bridges 162' and strikes there via the path 133.

The exemplary embodiment with the bridges 162', 162" and 163''' shown in FIG. 16 is a particularly advantageous embodiment, which can be implemented in this way or in a simple variation with the same effect by simple lasering, cutting, punching during the cutting to length, if the dissipative structure 162 is provided as a dissipative structure drawn out as far as the product edge, for example.

Figure 17:

FIG. 17 shows a further variant, which, like all previously shown variants, can again also be realized alone or in combination with any desired other exemplary embodiment in an electrostatic discharge-protected component according to the invention. In the top view shown in FIG. 17, the product edge 174 is again seen, but here it has neither a dissipative structure 172 drawn out as far as it, comparable for instance to the dissipative structure 122 of FIG. 14, but rather a dissipative structure 172 clearly offset from the product edge 174.

However, the product edge 174 has holes and indentations, are drawn in dashed and running from the product edge 174 into the dissipative structure 172 here. Through these openings, for example in the form of holes and/or indentations, an electrostatic discharge 1 can be effectively directed, with the result that it does not strike anywhere on the protective layer 7 but rather in a targeted manner via one of the desired strike paths 173, 173' and 173", which lead to the dissipative structure 172 at least partly through openings produced in a targeted manner. Again, the layer electrode 5 can thus be effectively protected.

This is a particularly advantageous embodiment, which can be realized, can be produced by simple lasering, cutting, punching during the cutting to length.

The invention proposes for the first time that, through the provision of simple discontinuities and/or exposure of certain points or areas of the dissipative structures of an electric, electronic and/or optoelectronic component, an electrostatic discharge taking place is directed thereto, and thus a random electrostatic discharge with expected damage to the layer electrode(s) of the component can be prevented.

LIST OF REFERENCE NUMBERS 1 electrostatic discharge
2 dissipative structure
3 desired strike path
3' desired strike path
3" desired strike path
4 product edge
5 layer electrode
6 substrate
7 protective layer
8 dielectric material
9 undesired strike path
122 dissipative structure which is part of the product edge
124 product edge
133 desired strike path, lateral
133' desired strike path, lateral
133" desired strike path, lateral
134 product edge with dissipative structure
138 dielectric material
153 dissipative structure, bridge
162 dissipative structure with lateral bridges
162' lateral bridge of the dissipative structure 162
162" lateral bridge of the dissipative structure 162
162"' lateral bridge of the dissipative structure 162
172 dissipative structure with lateral indentations
173 desired strike path, lateral
173' desired strike path, lateral
173" desired strike path, lateral
174 product edge with holes

The invention claimed is:

1. An electric, electronic and/or optoelectronic component comprising:

at least one dissipative structure, which is suitable for dissipating electrostatic discharges, at least one layer electrode with a conductive structure, which represents an area sensitive to an electrostatic discharge, and at least one protective layer applied over the whole surface, which covers both the layer electrode and the dissipative structure, arranged in such a way that the sensitive area and the dissipative structure are electrically isolated from one another and, although the sensitive area is encapsulated with respect to the environment, the protective layer nevertheless has means above the dissipative structure and/or laterally from the dissipative structure by which an electrostatic discharge is directed on the surface of the protective layer toward the dissipative structure, wherein the means for directing the electrostatic discharge is an exposure of the dissipative structure in a product edge of the component made by processing the component to length, and wherein the means for directing the electrostatic discharge direct the electrostatic discharge at least partially along the surface of the protective layer, effectively guiding the electrostatic discharge to the exposure, and thereby rendering the electrostatic discharge harmless for the thus protected component through the dissipative structure.

2. The component according to claim 1, wherein sensor fields are provided within the sensitive area.

3. The component according to claim 1, wherein the sensitive area comprises non-transparent conductor paths, which guarantee areal conductivity accompanied by transparency for the human eye.

4. The component according to claim 1, wherein the protective layer comprises one or more plies.

5. The component according to claim 1, wherein the protective layer comprises one or more plies, which include at least one film, a plastic film, a composite material film, a metallic foil, a metal-oxide coating, a ceramic coating, and/or a composite made of a combination of different plies.

6. The component according to claim 1, which can be produced by printing.

7. The component according to claim 1, in which a layer electrode is present embedded in a dielectric material.

8. The component according to claim 1, in which an adhesive is used as dielectric material.

9. The component according to claim 1, wherein the product edge is present after cutting the component to length out of a continuous strip.

10. The component according to claim 9, in which a hole is provided in the product edge as discontinuity.

11. The component according to claim 1, in which at least one discontinuity is provided as means for directing the electrostatic discharge.

* * * * *